United States Patent
Ribner et al.

Patent Number: 5,283,578
Date of Patent: Feb. 1, 1994

[54] MULTISTAGE BANDPASS DELTA SIGMA MODULATORS AND ANALOG-TO-DIGITAL CONVERTERS

[75] Inventors: David B. Ribner; David H. K. Hoe, both of Schenectady, N.Y.

[73] Assignee: General Electric Company, Schenectady, N.Y.

[21] Appl. No.: 976,806

[22] Filed: Nov. 16, 1992

[51] Int. Cl.$^5$ .............................................. H03M 3/02
[52] U.S. Cl. ................................. 341/143; 341/118
[58] Field of Search ................................ 341/118, 143

[56] References Cited

U.S. PATENT DOCUMENTS

| | | | |
|---|---|---|---|
| 5,061,928 | 10/1991 | Karema et al. | 341/143 |
| 5,065,157 | 11/1991 | Ribner et al. | 341/143 |
| 5,084,702 | 1/1992 | Ribner | 341/143 |
| 5,103,229 | 4/1992 | Ribner | 341/143 |
| 5,142,286 | 8/1992 | Ribner et al. | 341/143 |
| 5,148,166 | 9/1992 | Ribner | 341/143 |
| 5,148,167 | 9/1992 | Ribner | 341/143 |
| 5,198,817 | 3/1993 | Walden et al. | 341/143 |

OTHER PUBLICATIONS

D. B. Ribner, "A Comparison of Modulator Networks for High-Order Oversampled Sigma–Delta Analog-to-Digital Converters", IEEE Trans. on Circuits and Systems, vol. CAS-38, No. 2, pp. 145–159, Feb. 1991.

R. Schreier et al., "Bandpass Sigma Delta Modulation", Electronics Letters, vol. 25, No. 23, Nov. 9, 1989, pp. 1560–1561.

Z. X. Zhang et al., "Bandpass ΔΣ A/D Converter Using Two–Path Multibit Structure", Electronics Letters, vol. 27, No. 22, Oct. 24, 1991, pp. 2008–2009.

R. Schreier et al., "Multibit Bandpass Delta–Sigma Modulations Using N-Path Structures", IEEE International Symposium on Circuits and Systems, May 1992, pp. 593–596.

*Primary Examiner*—Marc S. Hoff
*Attorney, Agent, or Firm*—Marvin Snyder

[57] ABSTRACT

An architecture for oversampled delta-sigma (Δ-Σ) analog-to-digital (A/D) conversion of high-frequency, narrow-band signals includes multistage Δ-Σ modulators that incorporate band-reject noise shaping centered at one fourth the clock frequency Fs. These modulators cascaded with a bandpass digital filter also centered at a frequency of Fs/4 perform A/D conversion for high-frequency, narrow-band signals centered at the same frequency. The bandpass modulators are implemented by use of resonators in existing low-pass multistage modulators.

15 Claims, 15 Drawing Sheets

MULTISTAGE BANDPASS DELTA SIGMA MODULATORS AND ANALOG-TO-DIGITAL CONVERTERS

BACKGROUND OF THE INVENTION

1. Field of the Invention

This invention relates in general to analog-to-digital (A/D) converters and, more particularly, to a new architecture for oversampled delta-sigma (Δ-Σ) A/D conversion of high frequency, narrow band signals using cascaded low order stages to obtain high overall order of noise shaping.

2. Description of the Prior Art

Prior art single-loop bandpass delta-sigma (Δ-Σ) modulation is described by R. Schreier and M. Snelgrove in "Bandpass Sigma Delta Modulation," *Electronics Letters*, Vol. 25, 9th Nov. 1989, pp. 1560–1561. Z.X. Zhang, G.C. Temes and Z. Czarnul in "Bandpass ΔΣ A/D Converter Using Two-Path Multibit Structure", Electronics Letters, Vol. 27, 24th Oct. 1991, pp. 2008–2009, citing Schreier et al., supra, describe a modification of the basic structure using N-path switched capacitor circuits. Subsequently, R. Schreier, G.C. Temes, A.G. Yesilyurt, Z.X. Zhang, Z. Czarnul, and A. Hairapetian in "Multibit Bandpass Delta-Sigma Modulators Using N-Path Structures", *IEEE International Symposium on Circuits and Systems*, May 1992, pp. 593–596, describe simulation results of two switched-capacitor circuits for use in a multi-bit bandpass sigma-delta modulator.

Typically, cascaded low-order delta-sigma stages have been used to implement higher order delta-sigma modulators for A/D conversion of low-pass signals. See, for example, D.B. Ribner, "A Comparison of Modulator Networks for High-Order Oversampled Sigma-Delta Analog-to-Digital Converters," *IEEE Trans. Circuits and Systems*, Vol. CAS-38, No. 2, pp. 145–159, Feb. 1991. Those cascades comprise combinations of first and second-order individual stages and thereby avoid the stability problem prone to single-loop modulators of third-order and higher. See also D.E. Ribner U.S. Pat. Nos. 5,084,702, 5,103,229, and 5,148,166, all assigned to the instant assignee, for further background on plural-order sigma-delta analog-to-digital converters. U.S. Pat. Nos. 5,084,702, 5,103,229 and 5,148,166 are hereby incorporated by reference.

SUMMARY OF THE INVENTION

It is therefore an object of the present invention to provide a new architecture for oversampled delta-sigma (Δ-Σ) analog-to-digital (A/D) conversion of high-frequency, narrow-band signals.

Briefly, in accordance with a preferred embodiment of the invention, an architecture for multistage delta-sigma (Δ-Σ) bandpass modulators incorporates band-reject noise shaping centered at one fourth the clock frequency Fs. The bandpass modulators of this invention may be implemented by substituting for each of the integrators having z domain transfer function $$H_I(z) = \frac{z^{-1}}{1 - z^{-1}}$$

a resonator having z domain transfer function $$H_R(z) = \frac{-z^{-2}}{1 + z^{-2}}$$

in any existing low-pass multistage modulators of the type described in D.B. Ribner U.S. Pat. Nos. 5,103,229, 5,084,702, and 5,148,166 which, when cascaded with a bandpass digital filter centered at frequency Fs/4 can perform A/D conversion for high-frequency, narrow-band signals centered at the same frequency. In the above equations, z is the discrete time frequency variable.

BRIEF DESCRIPTION OF THE DRAWINGS

The foregoing and other objects, aspects and advantages will be better understood from the following detailed description of a preferred embodiment of the invention with reference to the accompanying drawings wherein like numerals represent like elements and in which.

DETAILED DESCRIPTION OF A PREFERRED EMBODIMENT OF THE INVENTION

Figure 1:
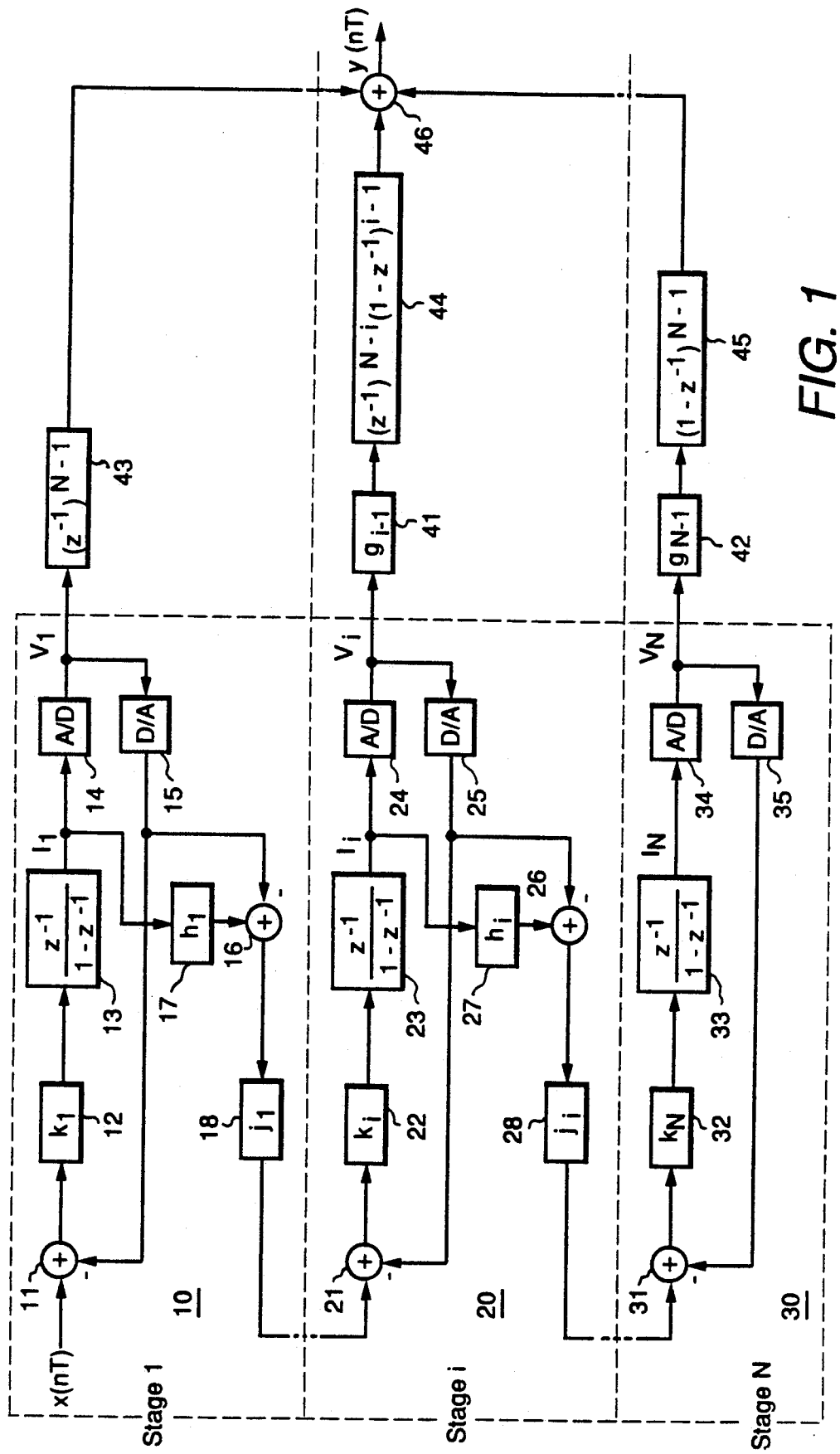
FIGS. 1 to 4 are block diagrams of low-pass multistage Δ-Σ A/D converters.

FIGS. 1–4 illustrate examples of low-pass modulators. More particularly, FIG. 1 illustrates a Multiple First-Order Cascade (MFOC) modulator that is capable of Nth order sinusoidal noise shaping so as to suppress low frequency quantization noise. The MFOC modulator generates a sampled-data digital response y(nT) to a sampled-data input voltage x(nt), which response is supplied to a decimation filter (not shown) that provides the ultimate analog-to-digital (A/D) conversion result. The MFOC modulator is illustrated as having N stages, although it typically is implemented with no more than three stages since mismatches and low gain cause leakage of lower order quantization noise to the output and thereby limit performance.

Stage 1, the first Δ-Σ stage 10, includes an analog subtractor 11 to which the analog sampled-data input voltage is supplied as a minuend input signal. Subtractor 11 is also supplied with a first analog feedback signal as the subtrahend input signal. The resulting difference output signal from subtractor 11 constitutes a first error signal, which is scaled in a scaling element 12 by a scaling coefficient $k_1$ and then integrated by an integrator 13 to generate a first integrator output voltage $I_1$. Integrator output voltage $I_1$ is digitized in an A/D converter 14 to generate, for the first Δ-Σ modulator stage 10, a digital output signal $V_1$ that corresponds to the sampled-data input signal x(nT). A digital-to-analog (D/A) converter 15 converts the A/D converter 14 output voltage $V_1$ into the aforementioned first analog feedback signal which is supplied to subtractor 11 as the subtrahend input signal for completing the first feedback loop. The first analog feedback signal voltage from D/A converter 15 is also supplied to another analog subtractor 16 as the subtrahend input signal therefor. Subtractor 16 receives as its minuend input signal the first integrator output signal $I_1$ scaled by a scaling coefficient $h_1$ by scaling element 17. Subtractor 16 generates a difference signal that corresponds to the negative of the quantization noise of the first Δ-Σ modulator stage 10 and, after scaling by a scaling coefficient $j_1$ of a scaling element 18, is used as an input signal for the second Δ-Σ modulator stage which, in the illustration, is ith Δ-Σ modulator 20.

The ith Δ-Σ modulator stage 20 includes an analog subtractor 21 receiving, as its minuend signal, the scaled negative quantization noise of a preceding (i-1)th Δ-Σ modulator stage which, in the embodiment illustrated, is the first Δ-Σ modulator stage 10. Subtractor 21 is supplied with the analog feedback signal of the ith Δ-Σ modulator stage 20 as the subtrahend input signal. The resulting difference output signal from subtractor 21 is the ith error signal, which is scaled in a scaling element 22 by a scaling coefficient $k_i$ and then integrated by an integrator 23 to generate ith integrator output signal $I_i$. The integrator output signal $I_i$ is digitized in an A/D converter 24 to generate a digital output signal $V_i$ that corresponds to the negative of the scaled quantization noise of the preceding Δ-Σ modulator which, in the embodiment illustrated, is the first Δ-Σ modulator 10. A D/A converter 25 converts the A/D converter 24 output signal $V_i$ to an analog signal constituting the Ith analog feedback signal supplied to subtractor 21 as the subtrahend input signal, completing the its feedback loop. The ith analog feedback signal is also supplied to another analog subtractor 26 as its subtrahend input signal. Subtractor 26 receives as its minuend input signal the ith integrator output signal $I_i$ scaled by a scaling element 27 with scaling coefficient $h_i$. Subtractor 26 generates a difference signal that corresponds to the negative of the quantization noise of the ith Δ-Σ modulator stage 20 and, after scaling by a scaling element 28 with scaling coefficient $j_i$, is used as an input signal voltage for the (i+1)th Δ-Σ modulator stage or, in the embodiment illustrated, Nth Δ-Σ modulator 30.

The Nth Δ-Σ modulator stage 30 includes an analog subtractor 31 receiving, as its minuend input signal, the negative of the scaled quantization noise of the preceding (N-1)th modulator stage or, in the embodiment illustrated, the ith Δ-Σ modulator stage 20. Subtractor 31 is supplied with the analog feedback signal of the Nth Δ-Σ modulator stage 30 as the subtrahend input signal. The resulting difference output signal from subtractor 31 is the Nth error signal, which is scaled in a scaling element 32 by a scaling coefficient $k_N$ and then integrated by an integrator 33 to generate Nth integrator output signal $I_N$. The integrator output signal $I_N$ is digitized in an A/D converter 34 to generate a digital output signal $V_N$ that corresponds to the negative of the scaled quantization noise of the preceding Δ-Σ modulator or, in the embodiment illustrated, the ith Δ-Σ modulator 20. A D/A converter 35 converts the A/D converter 34 output signal $V_N$ to an analog signal as the Nth analog feedback signal which is supplied to subtractor 31 as the subtrahend input signal, completing the ith feedback loop.

The output signals of the ith and Nth Δ-Σ modulator stages 20 and 30 are scaled by multipliers 41 and 42, respectively, with scaling coefficients $g_{i-1}$ and $g_{N-1}$, respectively. The $V_1$ output signal of the first Δ-Σ modulator stage 10 is delayed by a delay element 43 to compensate for the delay in $V_N$ output signal of the Nth Δ-Σ modulator stage 30. The $V_i$ output signal of the ith Δ-Σ modulator stage 20 is likewise delayed and additionally digitally differentiated in a delay and differentiator element 44. Finally, the $V_N$ output signal of the Nth Δ-Σ modulator 30 is differentiated in a differentiator element 45. The output signals of elements 43, 44 and 45 are combined by a digital adder 46 to generate the digital output signal y(nT).

Figure 2:
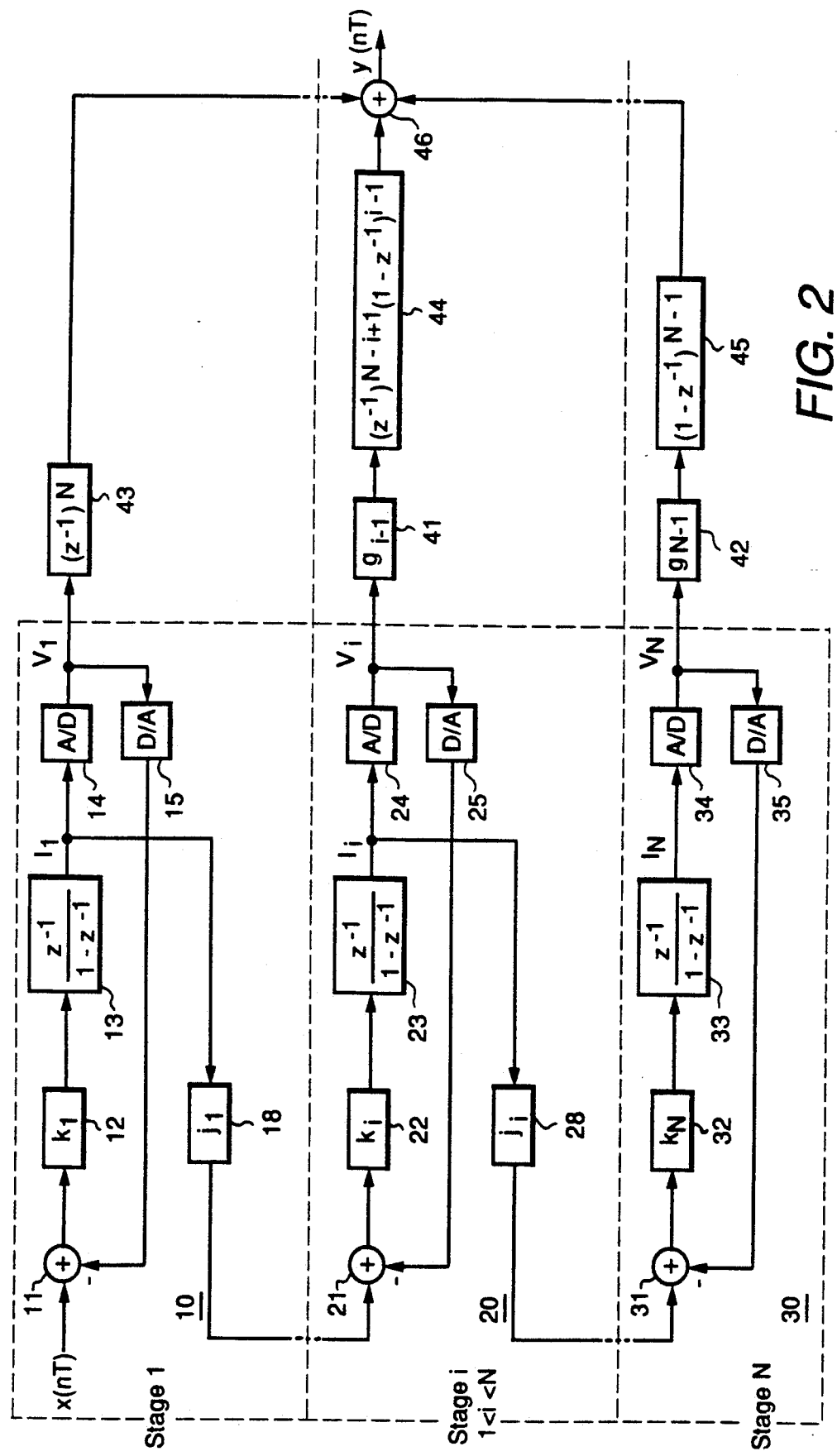
Figure 3:
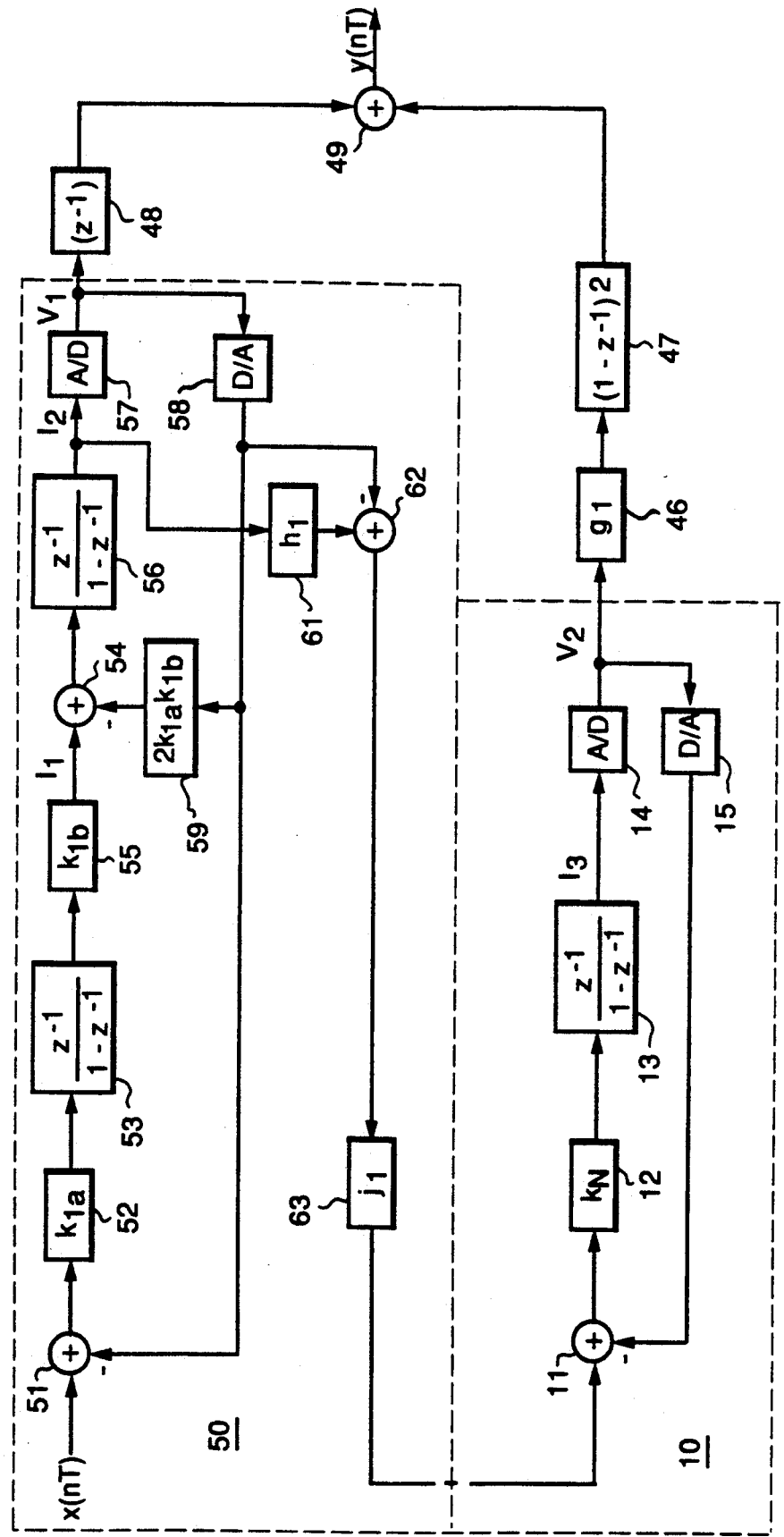
Figure 4:
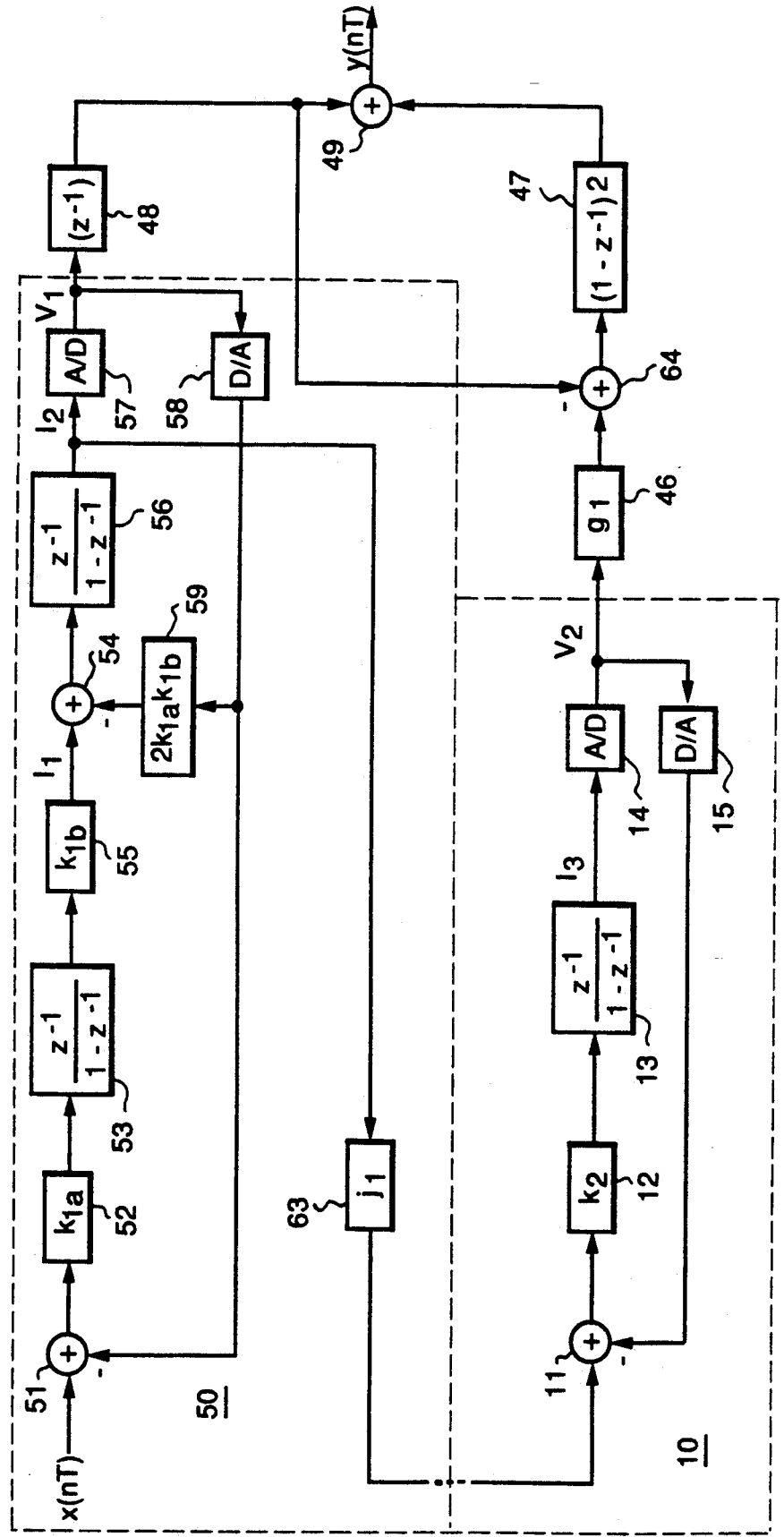

The type of Δ-Σ MFOC modulator shown in FIG. 1 uses the difference between A/D and D/A signals of each stage as the input signal to the following stage and is termed a quantization cascaded modulator and designated MFOCI (using an extension to the terminology introduced in the Ribner paper, supra, which is hereby incorporated by reference). The scaling coefficients $g_i$, $h_i$, $j_i$, and $k_i$, where i=1...N for this and the following prior art modulators of FIGS. 2 to 4, are discussed in the Ribner paper, supra. In FIG. 1 hereof, however, $$g_{i-1} = \frac{1}{j_1 j_2 \ldots j_{i-1}}$$

for stage i, and $$g_{N-1} = \frac{1}{j_1 j_2 \ldots j_{N-1}}$$

for stage N, while $h_i = 1/k_i$ for stage i, (where i=1...N), where $k_1$ through $k_N$ are arbitrary coefficients, typically ½, and $j_1$ through $j_{N-1}$ are also arbitrary and typically equal to unity. These coefficients are used for signal scaling.

FIG. 2 shows a Multiple First Order Cascade modulator MFOC2, which differs from the MFOCI modulator shown in FIG. 1 in that the integrator output signal of a stage is taken directly as the input signal to the following stage; this is termed an integrator cascaded modulator. Again, practical implementations have been limited to three stages or less due to matching and finite gain constraints. In FIG. 2, $$g_{i-1} = \frac{1}{j_1 j_2 \ldots j_{i-1} k_1 k_2 \ldots k_{i-1}},$$

for stage i, $$g_{N-1} = \frac{1}{j_1 j_2 \ldots j_{N-1} k_1 k_2 \ldots k_{N-1}}$$

for stage N, and $k_1$ through $k_N$ are arbitrary coefficients and typically ½, while $j_1$ through $j_{N-1}$ are also arbitrary and typically equal to unity. The next two modulators, shown in FIGS. 3 and 4, are Second-Order First-Order Cascade modulators, designated SOFOC1 and SOFOC2 respectively, achieving third-order noise shaping with a much lower sensitivity to mismatch and finite amplifier gain.

FIG. 3 shows only two cascaded stages, the first one of which is a second-order Δ-Σ modulator stage 50. The quantization noise of the initial, second-order Δ-Σ modulator stage 50 is supplied to the final, first-order Δ-Σ modulator stage 10. The quantization noise of the final, first-order Δ-Σ modulator stage 10 is differentiated twice by a differentiator 47 to generate a signal that cancels the quantization noise of the initial, second-order Δ-Σ modulator stage 50 and thus provides third-order noise shaping. It will be observed that the final, first-order Δ-Σ modulator stage 10 is identical with the first Δ-Σ modulator stage 10 shown in FIG. 1.

More particularly, second-order Δ-Σ modulator stage 50 includes an analog subtractor 51 which receives the analog sampled-data input signal x(nT) as a minuend input signal. Subtractor 61 receives the "outside loop" feedback signal in the second-order Δ-Σ modulator stage 50 as the subtrahend input signal. The resulting difference output signal from subtractor 51 constitutes a first error signal. The first error signal is scaled by a scaling element 52 with coefficient $k_{1a}$ and integrated by an integrator 53 to generate a first integrator signal voltage $I_1$. Integrator output signal $I_1$ is scaled in a scaling element 55 with coefficient $k_{1b}$ and applied to an analog subtractor 54 as the minuend input signal. Subtractor 54 receives the "inside loop" feedback signal in the second-order Δ-Σ modulator stage 50 as the subtrahend input signal. The resulting difference output signal from subtractor 54 is integrated by an integrator 56 to generate a second integrator output signal $I_2$. The quantization noise of Δ-Σ modulator stage 50 is thus twice-integrated, so that Δ-Σ modulator stage 50 is a second-order modulator. An A/D converter 57 converts the second integrator 56 output signal $I_2$ to the digital output voltage $V_1$ of second-order Δ-Σ modulator 50. A D/A converter 58 converts digital output signal $V_1$ from A/D converter 57 to an analog signal which is used in the "outside loop" feedback applied to subtractor 51. This same output signal from D/A converter 58 is scaled with the coefficient $2k_{1a}k_{1b}$ in a scaling element 59 and then used as the "inside loop" feedback signal applied to subtractor 54. The output signal of second integrator 56 is scaled by a scaling element 61 with coefficient $h_1$ and then subtractively combined with the analog output signal of D/A converter 58 in an analog subtractor 62. Analog subtractor 62 generates a difference signal that corresponds to the quantization noise of the second-order Δ-Σ modulator stage 50 and provides an input signal for the final Δ-Σ modulator stage 10. Output digital signal $V_1$ from A/D converter 57 is delayed by a delay element 48 and combined with the output signal of a digital differentiator 47 in digital adder 49 to generate digital output signal y(nT).

Theoretically, the response of the over-sampling converter shown in FIG. 3 is the same as that of the over-sampling converter shown in FIG. 1, assuming a three-stage converter with only the thrice-differentiated quantization noise of the final Δ-Σ modulator stage contaminating the desired response. The advantage of the converter of FIG. 3 over the three-stage converter of FIG. 1 is that the noise at the output of second-order Δ-Σ modulator stage 50 of FIG. 3 already has second-order shaping, so mismatches of component values and limitations on open-loop gains of integrators 53, 56 and 13 in the converter of FIG. 3 can result in leakage of only second-order and first-order shaped noise, respectively, through final Δ-Σ modulator stage 10. In FIG. 3, $$h_1 = \frac{1}{k_{1a}k_{1b}} \text{ and } g_1 = \frac{1}{j_1}$$

where $k_{1a}$, $k_{1b}$ and $k_2$ are arbitrary and typically ½, while $j_1$ is arbitrary and typically equal to unity.

FIG. 4 shows a modulator designated SOFOC2, which differs from the SOFOC1 modulator shown in FIG. 3 in that the second integrator signal $I_2$ of second-order stage 50 is taken directly (after scaling by a scaling element 63 with coefficient $J_1$) as the input signal to the final stage. This is also termed an integrator cascaded modulator. In FIG. 4, $$g_1 = \frac{1}{j_1 k_{1a} k_{1b}},$$

where $k_{1a}$ and $k_{1b}$ are arbitrary and typically ½, while $j_1$ is arbitrary and typically equal to unity.

The multistage modulators shown in FIGS. 1-4 use digital networks to combine the individual output signals from the multiple stages into a single output signal that is supplied to the input of a subsequent digital decimation filter (not shown). The transfer functions for the digital networks differ, depending on the modulator topology, and are described in the Ribner paper, supra. The resulting output signal from any of these modulators is of the form $$Y(z) = z^{-N}X(z) + g_{N-1}(1-z^{-1})^N Q_N(z) \quad (1)$$

for MFOC1 and MFOC2, and $$Y(z) = z^{-3}X(z) + g_1(1-z^{-1})^3 Q_2(z) \quad (2)$$

for SOFOC1 and SOFOC2, where $Q_N$ is the quantization noise of stage N for MFOC1 and MFOC2, and $Q_2$ is the quantization noise of stage 2 for SOFOC1 and SOFOC2.

Bandpass modulators of the invention may be implemented by utilizing resonators instead of integrators in low pass multistage modulators of the type shown in FIGS. 1 to 4. Specifically, instead of employing the z domain transfer function $$H_I(z) = \frac{z^{-1}}{1 - z^{-1}}, \quad (3)$$

which is obtained by use of integrators, the resonator transfer function $$H_R(z) = \frac{z^{-2}}{1 + z^{-2}} \quad (4)$$

is employed. The latter transfer function differs from the integrator transfer function in that the single real pole at $z=1$ in $H_I(z)$ is transformed to a pair of complex conjugate poles at $z=e^{\pm j\pi/2}$ in $H_R(Z)$. Thus the original integrator with infinite DC gain is replaced by a resonator with infinite gain at a frequency $F_s/4$.

Figure 5B:
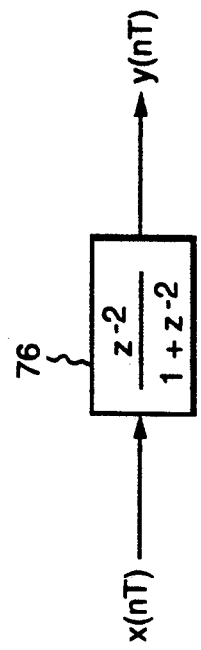
FIGS. 5A and 5B are functional block diagrams of the discrete time resonator employed in the present invention.
Figure 5A:
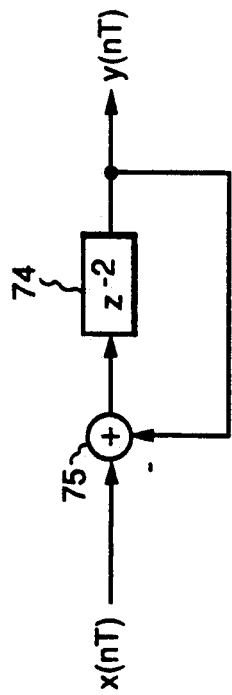

The above transformation may be illustrated as shown by FIGS. 5A and 5B. Specifically, the double delay resonator can be implemented with an inverting analog double delay (inverting dual sample and hold) 74 and an analog subtractor 75, as shown in FIG. 5A, to provide a resonator 76 having the transfer function $$\frac{z^{-2}}{1+z^{-2}}$$

as shown in FIG. 5B.

Figure 6A:
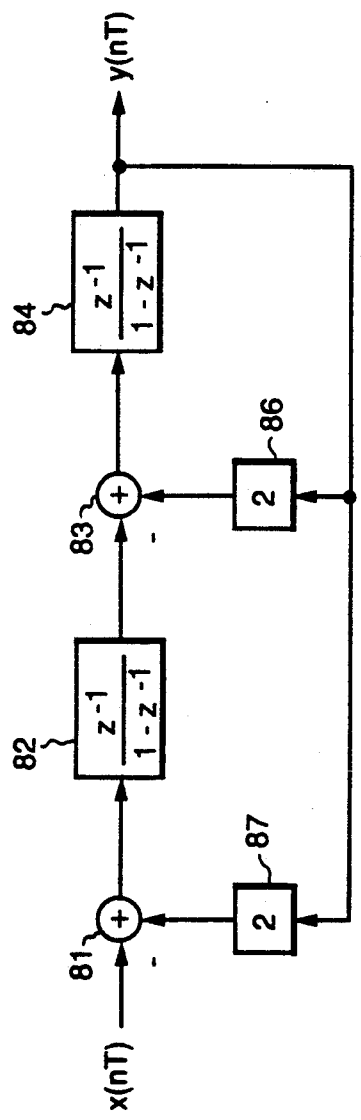
FIG. 6A is a block diagram of a resonator using unit-delay integrators according to one aspect of the invention.
Figure 6B:
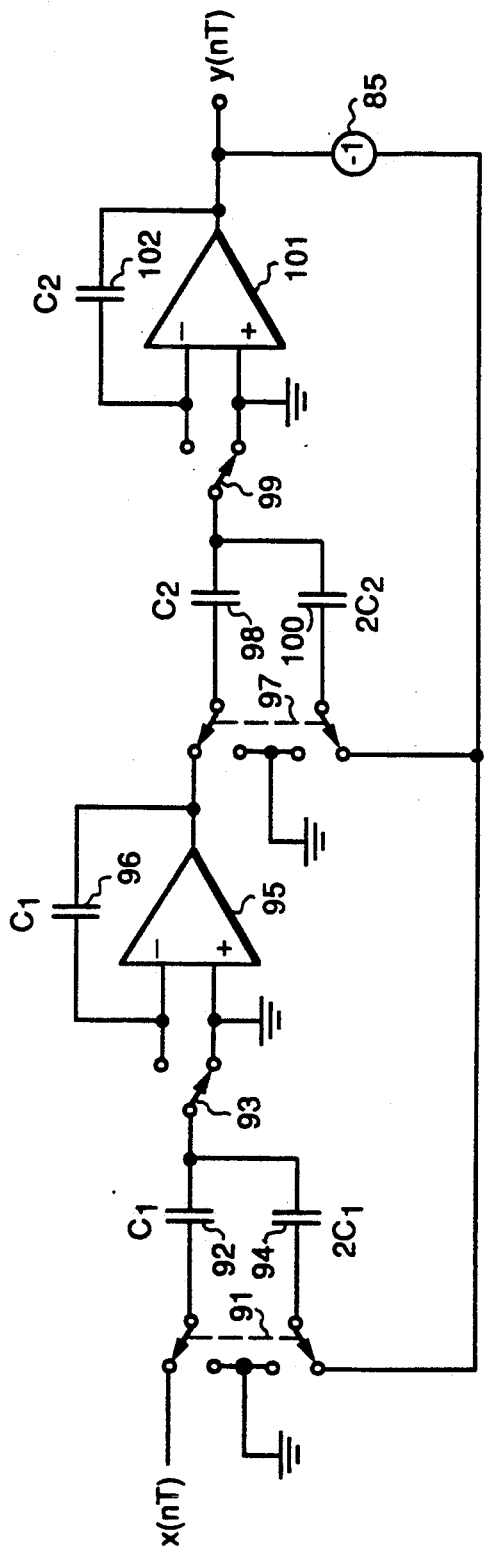
FIG. 6B is a schematic diagram of a switched-capacitor resonator implementation.

According to one aspect of the invention, a better implementation of resonator 76 of FIG. 5B employs unit delay switched capacitor (SC) integrators as shown in FIGS. 6A and 6B. Such integrators are also more tolerant of circuit imperfections. With specific reference to FIG. 6A, the analog sampled-data input signal $x(nT)$ is supplied to the minuend input of subtractor 81, which receives at its subtrahend input the "outside loop" feedback signal. The difference output signal from subtractor 81 is integrated by a first unit-delay integrator 82, and the integrated output signal from first integrator 82 is supplied to the minuend input of a second subtractor 83. The subtrahend input of subtractor 83 receives an "inside loop" feedback signal. The output difference signal from subtractor 83 is integrated by a second unit-delay integrator 84 to produce the output signal $y(nT)$. This signal is scaled by two in a scaling element 86 to generate the "inside loop" feedback signal supplied to subtractor 83. The output signal of integrator 84 is also scaled by two in a scaling element 87 to generate an "outside loop" feedback signal which is supplied to subtractor 81.

The SC circuit shown in FIG. 6B can be implemented fully differentially for better performance, and in that case inverter 85 is realized by a simple reversal in the connection for the differential output signal. More particularly, the analog sampled-data input voltage $x(nT)$ is supplied to one pole of a double-pole, double-throw (DPDT) sampling switch 91. This switch in practice is implemented with semiconductor switching devices but, for simplicity of illustration, is shown as a mechanical switch. The analog sampled-data input voltage $x(nT)$ is supplied by switch 91 to a capacitor 92 of capacitance value $C_1$ to charge the capacitor to the input voltage level during the first switching period when the other side of capacitor 92 is connected by a single-pole, double-throw (SPDT) switch 93 to ground. Also during this first switching period, switch 91 connects capacitor 94 to the output of an inverter 85 charging it to the negative of the output voltage $y(nT)$. Switch 93, like switch 91, is implemented with a semiconductor switching device. During the second switching period, switches 91 and 93 reverse the positions shown in FIG. 6B so that the charges on capacitors 92 and 94 are summed and applied to the inverting input of an operational amplifier 95. Capacitor 94 has a capacitance value $2C_1$, thereby providing the scaling factor of two for the "outside loop" feedback signal. Operational amplifier 95 is configured as an integrator with a feedback capacitor 96 having a capacitance value $C_1$ coupled between its output and its inverting input. The output signal of operational amplifier 95 is supplied to one pole of a DPDT sampling switch 97. The integrated output voltage of operational amplifier 95 is supplied by switch 97 to a capacitor 98 having a capacitance value $C_2$ to charge the capacitor to the output voltage level during the first switching period when the other side of capacitor 98 is connected by an SPDT switch 99 to ground. Also during this first switching period, capacitor 100 is connected by switch 97 to inverter 85 and is charged to the negative of the output signal $y(nT)$. During the second switching period, switches 97 and 99 reverse the positions shown in FIG. 6B so that the charges on capacitors 96 and 100 are summed and applied to the inverting input of an operational amplifier 101. Capacitor 100 has a capacitance value $2C_2$, thereby providing the scaling factor of two for the "inside loop" feedback signal. Operational amplifier 101 is configured as an integrator with a feedback capacitor 102 having a capacitance value $C_2$ connected between its output and its inverting input. The output signal of amplifier 101 is taken as the output signal $y(nT)$.

Figure 7A:
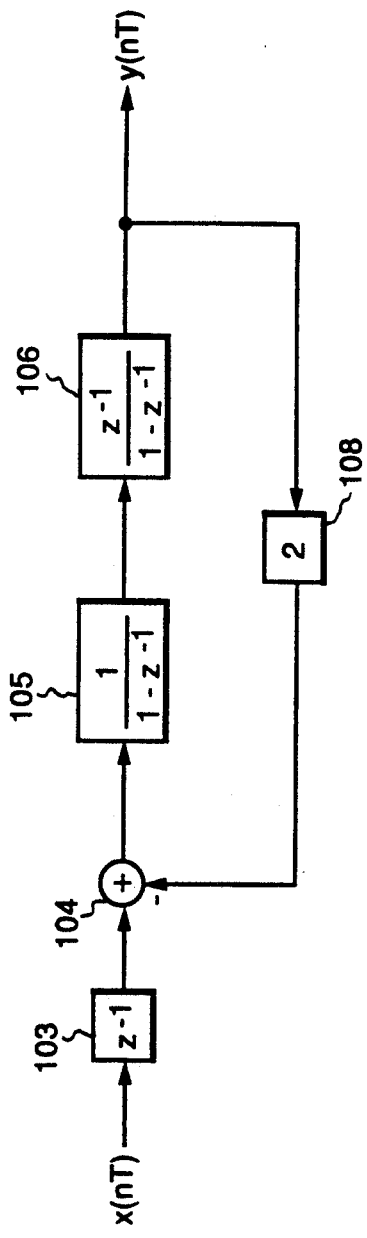
FIG. 7A is a block diagram of a resonator using unit-delay integrators according to another aspect of the invention.
Figure 7B:
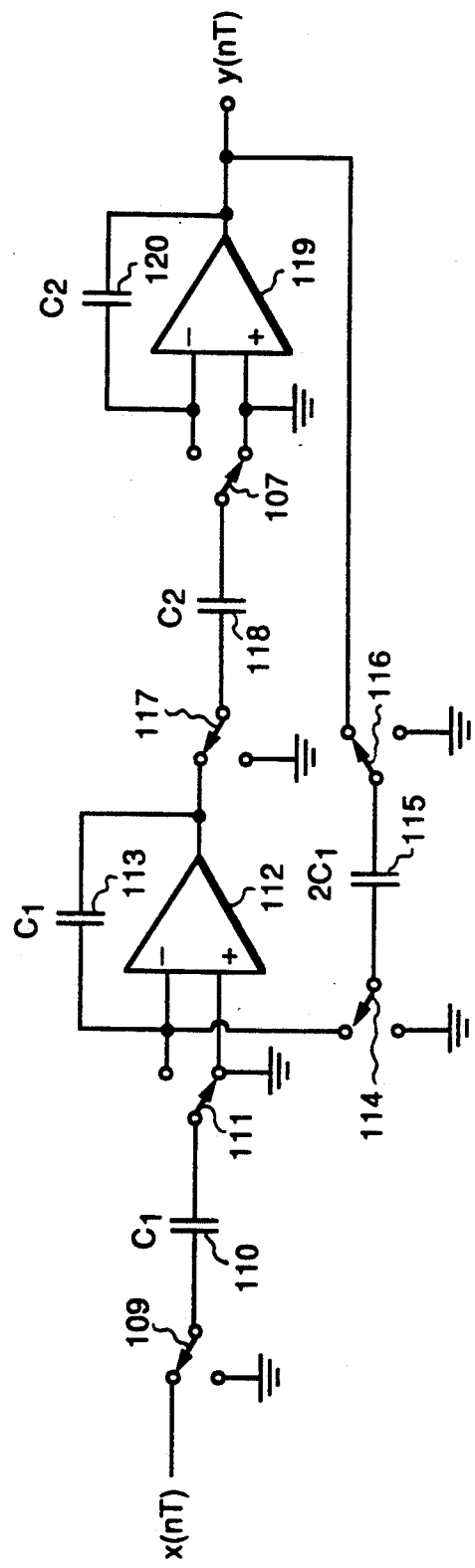
FIG. 7B is a schematic diagram of a switched-capacitor resonator implementation.

Another implementation of resonator 76 of FIG. 5B according to a second aspect of this invention is shown in FIGS. 7A and 7B. With specific reference to FIG. 7A, the analog sampled-data input signal $x(nT)$ is supplied to a unit-delay element 103, the output signal of which is provided as the minuend input signal to a subtractor 104. The subtrahend input signal to subtractor 104 is the feedback signal. The summed output difference signal from subtractor 104 is doubly integrated by a first integrator 105, which is a nondelayed integrator, and a second integrator 106. Integrator 106 is a unit-delay integrator and generates the resonator output signal $y(nT)$. This signal is scaled by two by scaling element 108 and supplied as the feedback signal to subtractor 104.

The SC circuit shown in FIG. 7B, like that of FIG. 6B, can be implemented fully differentially for better performance. More particularly, the analog sampled-data input voltage $x(nT)$ is supplied to one terminal of single-pole, double-throw (SPDT) sampling switch 109. The analog sampled-data input voltage $x(nT)$ is supplied by switch 109 to a capacitor 110, having a capacitance value $C_1$, to charge the capacitor to the input voltage during the first switching period when the other side of capacitor 110 is connected by SPDT switch 111 to ground. During the second switching period, switches 109 and 111 reverse the positions shown in FIG. 7B so that the voltage of capacitor 110 is applied to the inverting input of an operational amplifier 112. Operational amplifier 112 is configured as an integrator with a feedback capacitor 113 having a capacitance value $C_1$ connected between its output and its inverting input. During the first switching period, the voltage from a capacitor 115 is applied to the inverting input of operational amplifier 112 with SPDT switches 114 and 116 in the positions shown. Thus the feedback signal for the preceding time period is summed with the voltage from capacitor 110. Capacitor 115 has a capacitance value $2C_1$, thereby providing a scaling factor of two in the feedback signal. The output signal of operational amplifier 112 is supplied to one terminal of a SPDT sampling switch 117. The integrated output voltage of operational amplifier 112 is supplied by switch 117 to a capacitor 118 having a capacitance value $C_2$ to charge the capacitor to the output voltage during the first switching period when the other side of capacitor 118 is connected by an SPDT switch 107 to ground. During the second switching period, switches 117 and 107 reverse the positions shown in FIG. 7B so that the voltage of capacitor 118 is applied to the inverting input of an operational amplifier 119. Operational amplifier 119 is configured as an integrator with a feedback capacitor 120 having a capacitance value $C_2$ connected between its output and its inverting input. The output of operational amplifier 119 provides the resonator output signal $y(nT)$.

Figure 8A:
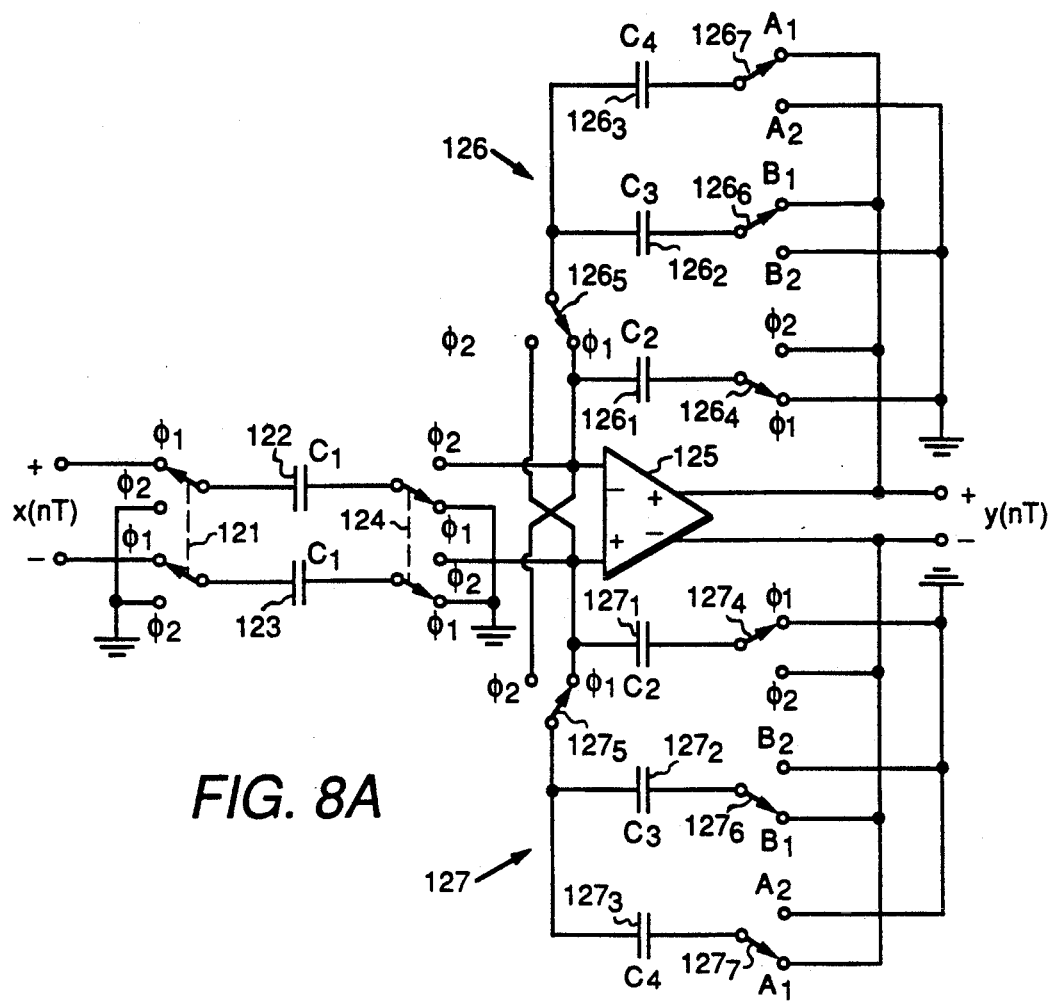
FIG. 8A is a schematic diagram of a two-path integrator which can be used as a resonator in practicing the invention.
Figure 8B:
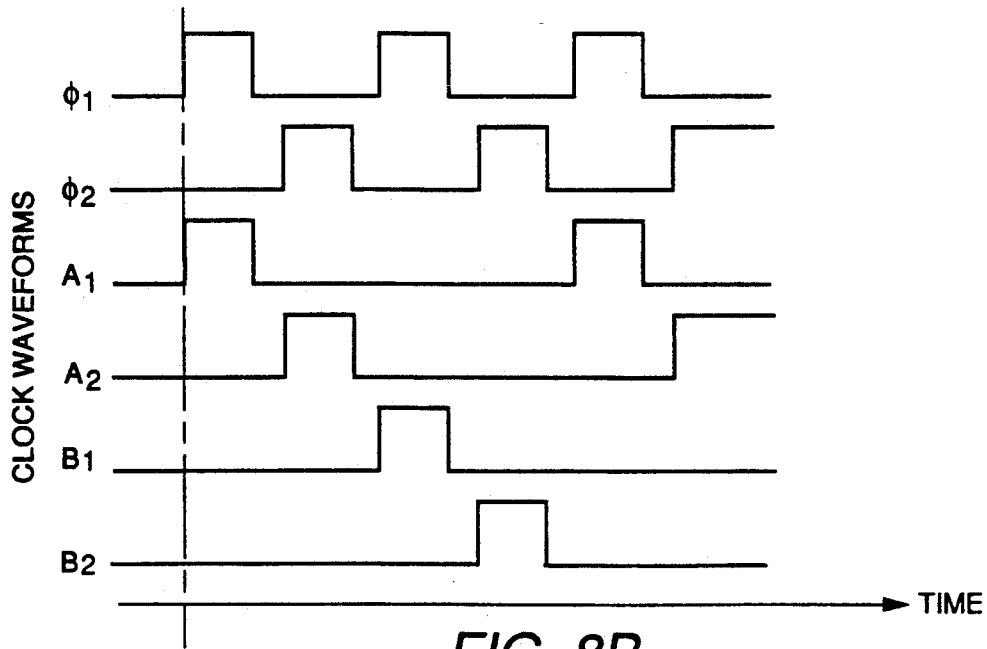
FIG. 8B is a timing diagram illustrating, the operation of the integrator shown in FIG. 8A.

FIGS. 8A and 8B illustrate a third implementation of a resonator which may be used in practicing the invention. FIG. 8A is a differential pseudo two-path integrator of the type described by R. Schreier et al., supra. More particularly, a differential analog sampled-data input voltage $x(nT)$ is supplied to a DPDT switch 121. A pair of capacitors 122 and 123, each having a capacitance value $C_1$, are connected in series between switch 121 and a second DPDT switch 124. During the clock phase $\phi_1$, as shown in FIG. 8B, capacitors 122 and 123 are charged to the differential input voltages. During the clock phase $\phi_2$, shown in FIG. 8B, switches 121 and 124 reverse the positions shown in FIG. 8A so that the voltages of charged capacitors 122 and 123 are applied to the differential inputs of a fully differential operational amplifier 125. Amplifier 125 has first and second switched capacitor networks 126 and 127 connected in feedback loops between its differential outputs and differential inputs. Network 126 includes capacitors 126₁, 126₂ and 126₃ having respective capacitive values $C_2$, $C_3$ and $C_4$. Capacitor 126₁ is connected to the inverting input of amplifier 125 and, through an SPDT switch 126₄, to either the noninverting output of the amplifier or ground. Switch 126₄ is operated with clock phases $\phi_1$ and $\phi_2$ as shown in FIG. 8B. Capacitors 126₂ and 126₃ are connected through an SPDT switch 126₅ to either the inverting or noninverting inputs of amplifier 125 and through respective SPDT switches 126₆ and 126₇ to either the noninverting output of the amplifier or ground. Switch 126₅ is operated with clock phases $\phi_1$ and $\phi_2$, while switches 126₆ and 126₇ are operated with clock phases $B_1$, $B_2$ and $A_1$, $A_2$, respectively, as shown in FIG. 8B. Network 127 is similarly constituted, comprising capacitors 127₁, 127₂ and 127₃, also having respective capacitive values $C_2$, $C_3$ and $C_4$. Likewise, switches 127₄ and 127₅ operate with clock phases $\phi_1$ and $\phi_2$, and switches 127₆ and 127₇ operate with clock phases $B_1$, $B_2$ and $A_1$, $A_2$.

In the circuit of FIG. 8A, input capacitors 122 and 123 sample the input signal $x(nT)$ during clock phase $\phi_1$. Also, during clock phase $\phi_1$, the charge on feedback capacitors 126₁ and 127₁ is transferred temporarily to storage capacitors 126₃ and 127₃ if on phase $A_1$ or storage capacitors 126₂ and 127₂ if on phase $B_1$. Following this, on clock phase $\phi_2$, the discharged capacitors 126₁ and 127₁ switch back into feedback whereupon charge is transferred to them from input capacitors 122 and 123 and from either storage capacitors 126₃ and 127₃ if on phase $A_2$ or storage capacitors 126₂ and 127₂ if on phase $B_2$. According to the switching sequence, the charge from two cycles earlier, subject to an inversion due to the cross-coupled wiring of switches 126₅ and 127₅, is transferred from the storage capacitors. A difference equation, based on charge conservation, may be written as $$y(nT) = -y((n-2)T) + \left(\frac{C_1}{C_2}\right) \times ((n-1)T). \tag{5}$$

After taking the z transform, we obtain, $$\frac{Y(z)}{X(z)} = \left(\frac{C_1}{C_2}\right) \frac{z^{-1}}{1+z^{-2}}. \tag{6}$$

This can also be used in the new bandpass modulators of the invention, provided an additional delay of $z^{-1}$ is included in series with the resonator.

Figure 9:
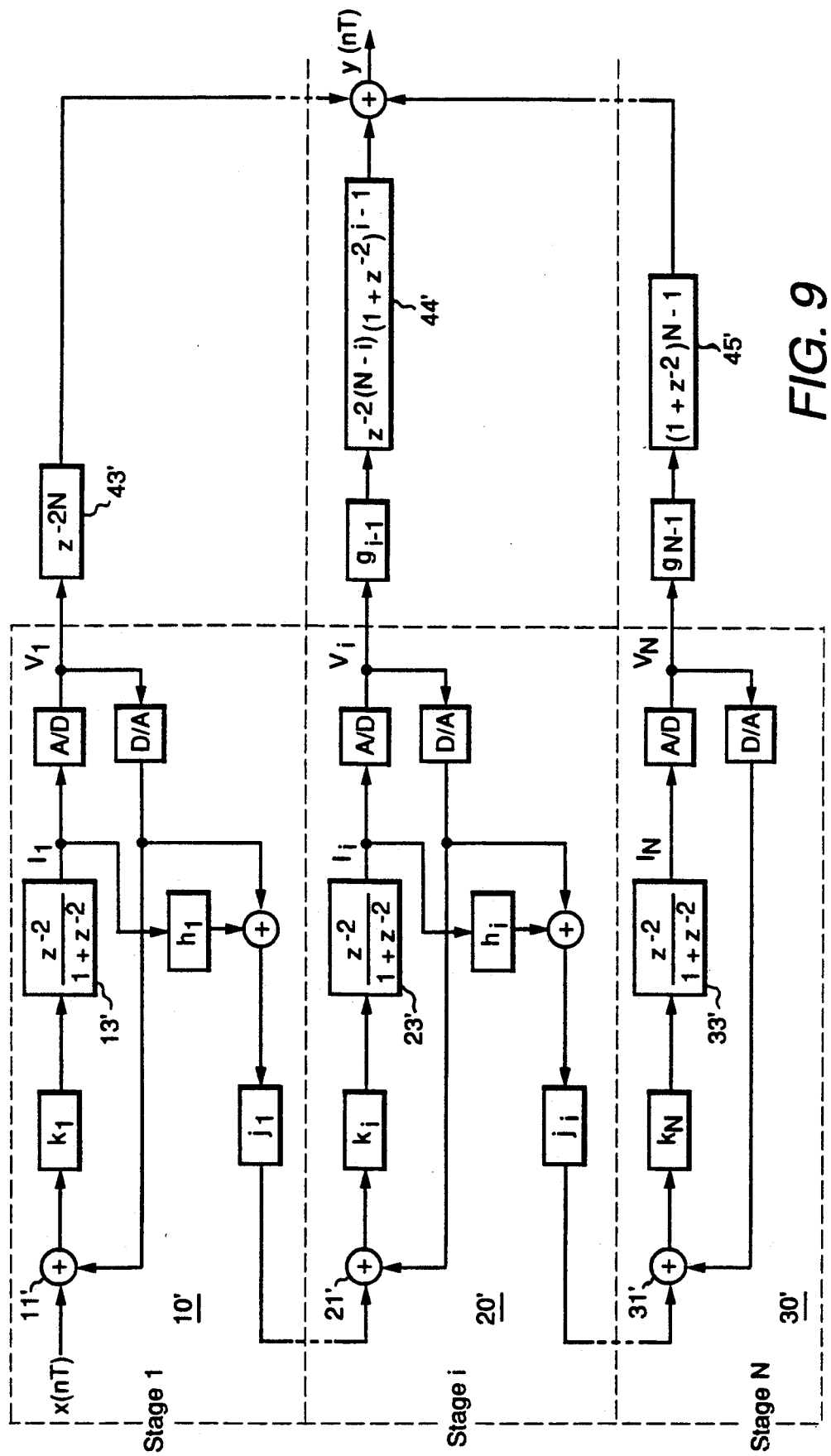
FIGS. 9–12 are block diagrams based on the multistage Δ-Σ A/D converters shown in FIGS. 1 to 4 implemented in accordance with the teachings of the invention.

The new bandpass modulators of the invention, shown in FIGS. 9 to 12, are improvements over the prior art modulators of FIGS. 1 to 4, respectively. FIG. 9 shows a Multiple Second-Order Resonator Cascade modulator denoted MSORC1 since it uses quantization signals rather than integrator signals as input signals to successive stages. The various g, h, j and k scaling coefficients in this modulator have the same values as the same respective coefficients in the modulator of FIG. 1. This modulator differs from the MFOC1 modulator of FIG. 1 in that it handles bandpass instead of low-pass signals and is therefore suitable for different applications. Comparing FIGS. 1 and 9, it will be noted that integrators 13, 23 and 33 of FIG. 1 have all been replaced with noninverting resonators 13', 23' and 33', which may take the form of any of the resonators shown in FIGS. 5 to 8. Additionally, the $V_1$ output signal of the first stage 10' is delayed by a delay element 43' to compensate for the delay in the $V_N$ output signal of the Nth $\Delta$-$\Sigma$ modulator stage 30'. The $V_i$ output signal of the ith $\Delta$-$\Sigma$ modulator stage 20' is likewise delayed, and is additionally digitally filtered by a cosine filter 44' with z domain transfer function $(1+z^{-2})^{i-1}$. Instead of subtractors 11, 21 and 31, adders 11', 21' and 31', respectively, are employed. The $V_n$ output signal of the Nth $\Delta$-$\Sigma$ modulator 30' is filtered by a cosine filter with transfer function $(1+z^{-2})^{N-1}$ in filter element 45'.

Figure 10:
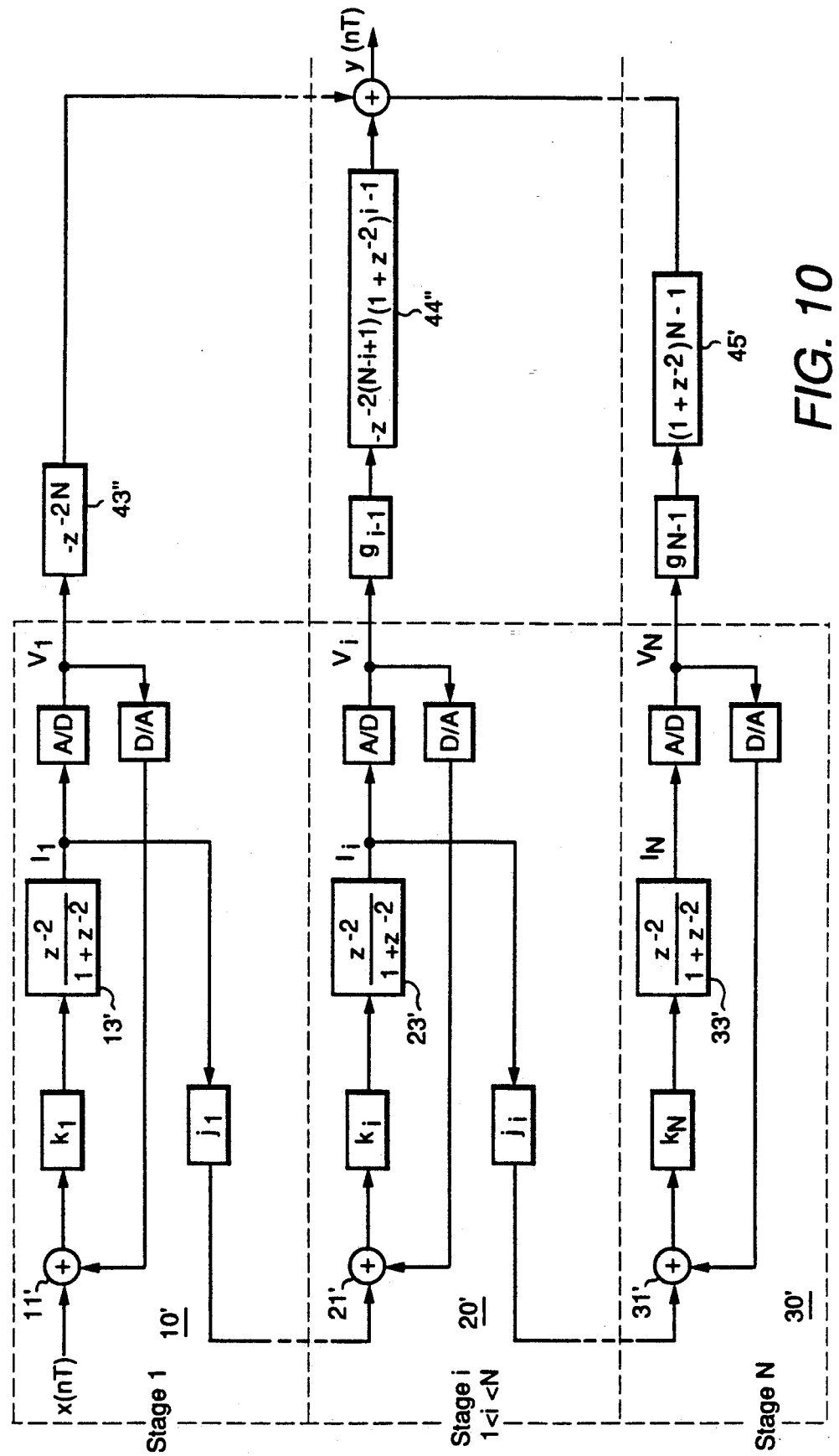

The Multiple Second-Order Resonator Cascade modulator MSORC2, shown in FIG. 10, uses integrator signal cascading as opposed to the quantization signal cascading used in MSORC1 of FIG. 9. The various g, j and k scaling coefficients in the MFOC2 modulator of FIG. 10 have the same values as the same respective coefficients in the modulator of FIG. 2. Contrasting FIGS. 2 and 10, delay/differentiator elements 43 and 44 of FIG. 2 have been replaced by delay/cosine filter elements 43" and 44", respectively that also invert the signal, while integrators 13, 23 and 33 of FIG. 2 have been replaced by noninverting resonators 13", 23" and 33", respectively, subtractors 11, 21 and 31 of FIG. 2 have been replaced by adders 11", 21" and 31", respectively, and differentiator element 45 of FIG. 2 has been replaced by a noninverting filter element 45' .

Figure 11:
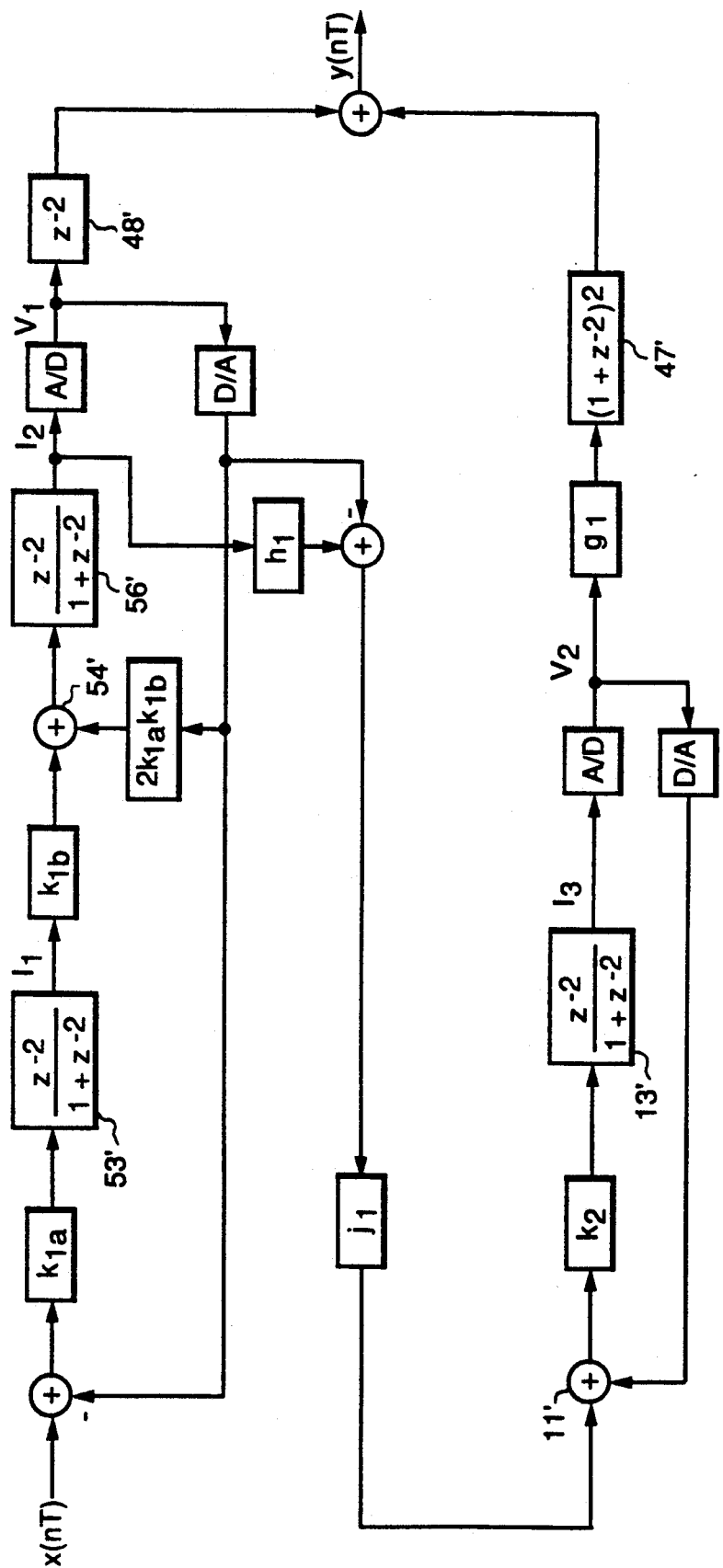
Figure 12:
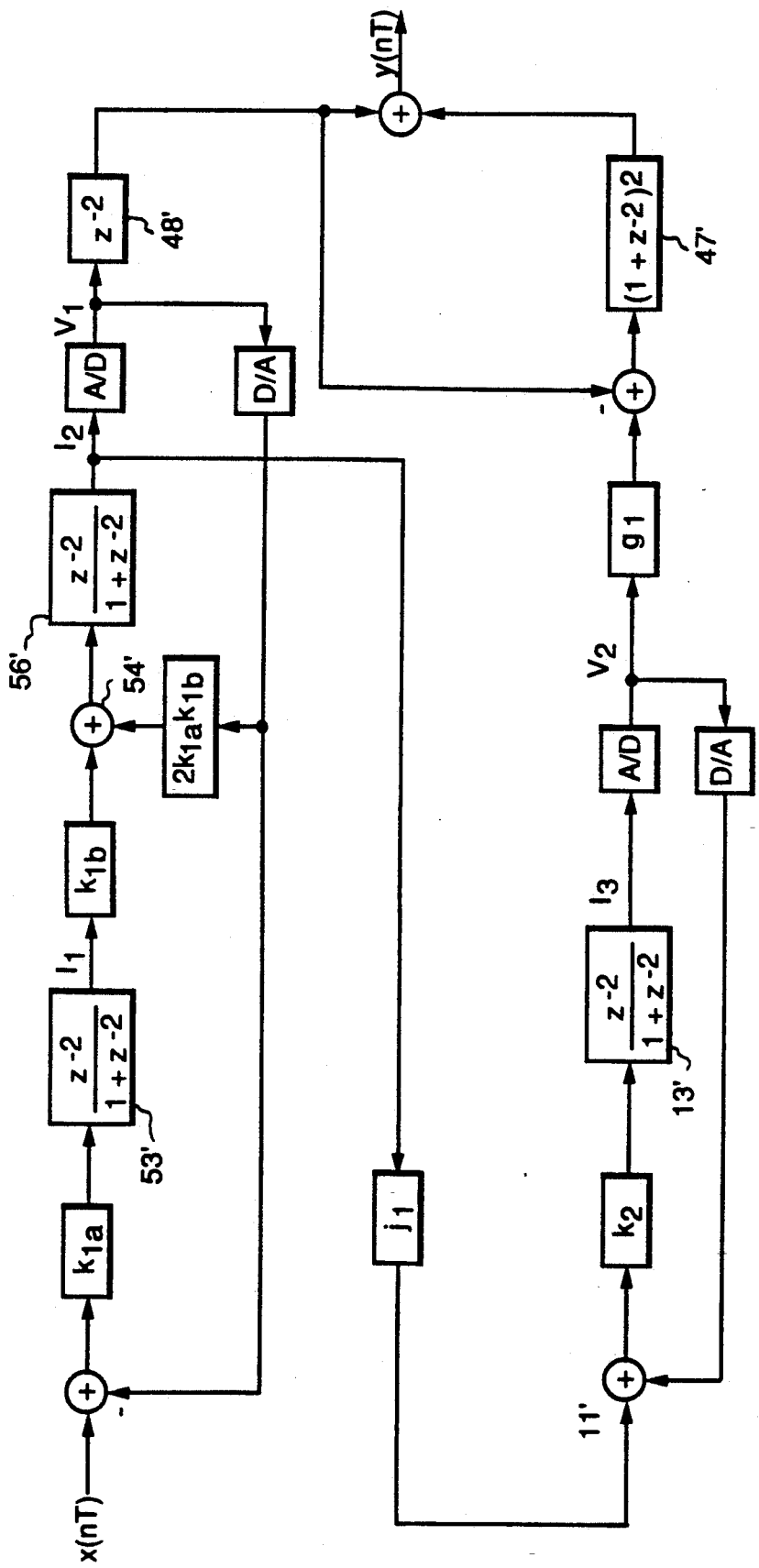

The networks of FIGS. 9 and 10 are each capable of implementing bandpass modulators with arbitrary even-order noise shaping. FIGS. 11 and 12 show sixth-order bandpass modulators based on the SOFOC modulators of FIGS. 3 and 4, respectively. The modulator of FIG. 11 is a Quad-Order Resonator Second-Order Resonator Cascade modulator, designated QUOSORCI, based on the SOFOCI modulator of FIG. 3 using quantization signal cascading. The various g, h, j and k scaling coefficients in the modulator of FIG. 11 have the same values as the same respective coefficients in the modulator of FIG. 3. Contrasting FIGS. 3 and 11, integrators 13, 53 and 56 of FIG. 3 have been replaced by noninverting resonators 13', 53' and 56', respectively, and digital differentiator 47 has been replaced by a cosine filter 47'. Additionally, the inner loop subtractor 54 of FIG. 3 has been replaced by an adder 54', and subtractor 11 has been replaced by an adder 11'. Also, delay element 48' has a $z^{-2}$ transfer function.

The modulator of FIG. 12, denoted QUOSORC2, is derived from the SOFOC2 modulator of FIG. 4 and also uses integrator signal cascading. The modulator of FIG. 12 employs noninverting resonators 13', 53' and 56' instead of integrators 13, 53 and 56, respectively, of FIG. 4 and uses a cosine filter 47' instead of digital differentiator 47 of FIG. 4. Additionally, the inner loop subtractor 54 of FIG. 4 has been replaced by an adder 54', subtractor 11 has been replaced by an adder 11', and delay element 48 has been replaced by delay element 48'. The various g, j and k scaling coefficients in the modulator of FIG. 12 have the same values as the same respective coefficients in the modulator of FIG. 4.

Thus the bandpass networks of FIGS. 9 to 12 differ from the low-pass versions of FIGS. 1 to 4 by the employment of resonators instead of integrators in the cascaded modulators, and by the employment of $-z^2$ instead of z in the digital combining functions. The scaling of those modulators using scaling coefficients $g_i$, $h_i$, $j_i$ and $k_i$, with $i=1-N$, follows the same procedure outlined for the corresponding low-pass modulators in the Ribner paper, supra.

The output equations for the new bandpass modulators are $$Y(z) = z^{-2N}X(z) + gN - 1(1 + z^{-2})^N Q_N(z) \quad (9)$$

for MSORC1 and MORSC2, and $$Y(z) = z^{-6}X(z) + g1(1 + z^{-2})^3 Q_N(z) \quad (10)$$

for QUOSORC1 and QUOSORC2. The corresponding magnitude noise transfer functions for the modulators are $$|H_Q(e^{j\omega T})| = \left| \frac{Y(e^{j\omega T})}{Q_N(e^{j\omega T})} \right| = g_{N-1}[2\cos(\omega T)]^N \quad (11)$$

for MSORC1 and MSORC2, and $$|H_Q(e^{j\omega T})| = \left| \frac{Y(e^{j\omega T})}{Q_2(e^{j\omega T})} \right| = g_1[2\cos(\omega T)]^3 \quad (12)$$

for QUOSORC1 and QUOSORC2.

One of the motivations for using cascaded modulators as mentioned earlier is that stability is insured if each stage is of order two or lower. Therefore, the MSORC1 and MSORC2 modulators are unconditionally stable since they are comprised of second-order stages. The QUOSORC1 and QUOSORC2 modulators also contain fourth-order stages; however, these are also unconditionally stable since they are generated from transforms of stable second-order low-pass modulators. This is a significant advantage over prior art single-loop bandpass implementations in R. Schreier and M. Snelgrove, supra.

Figure 13A:
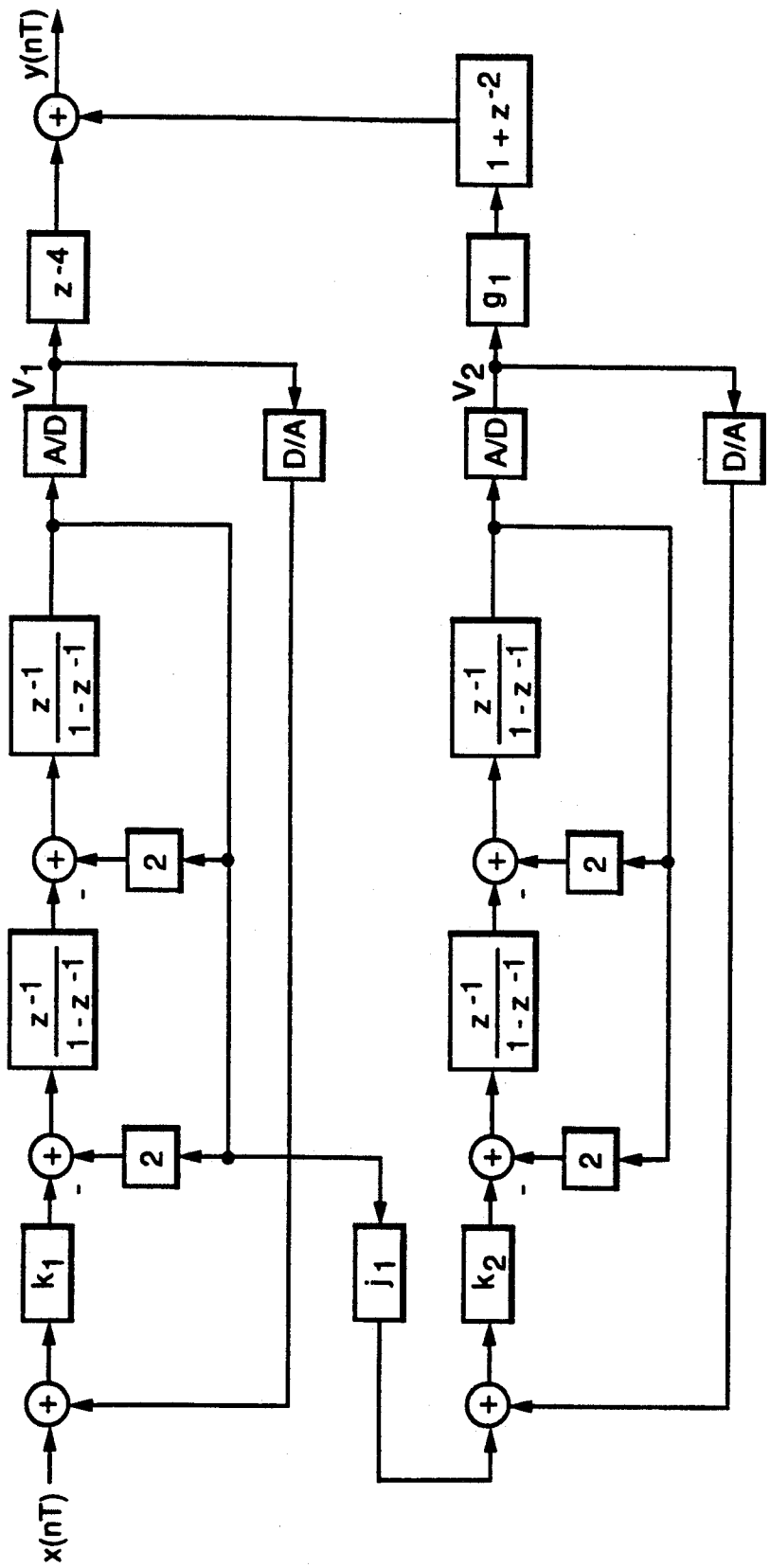
FIGS. 13A and 13B are block diagrams of fourth-order implementations of a multiple second-order cascade modulator using the unit-delay integrator based resonator of FIG. 6.
Figure 13B:
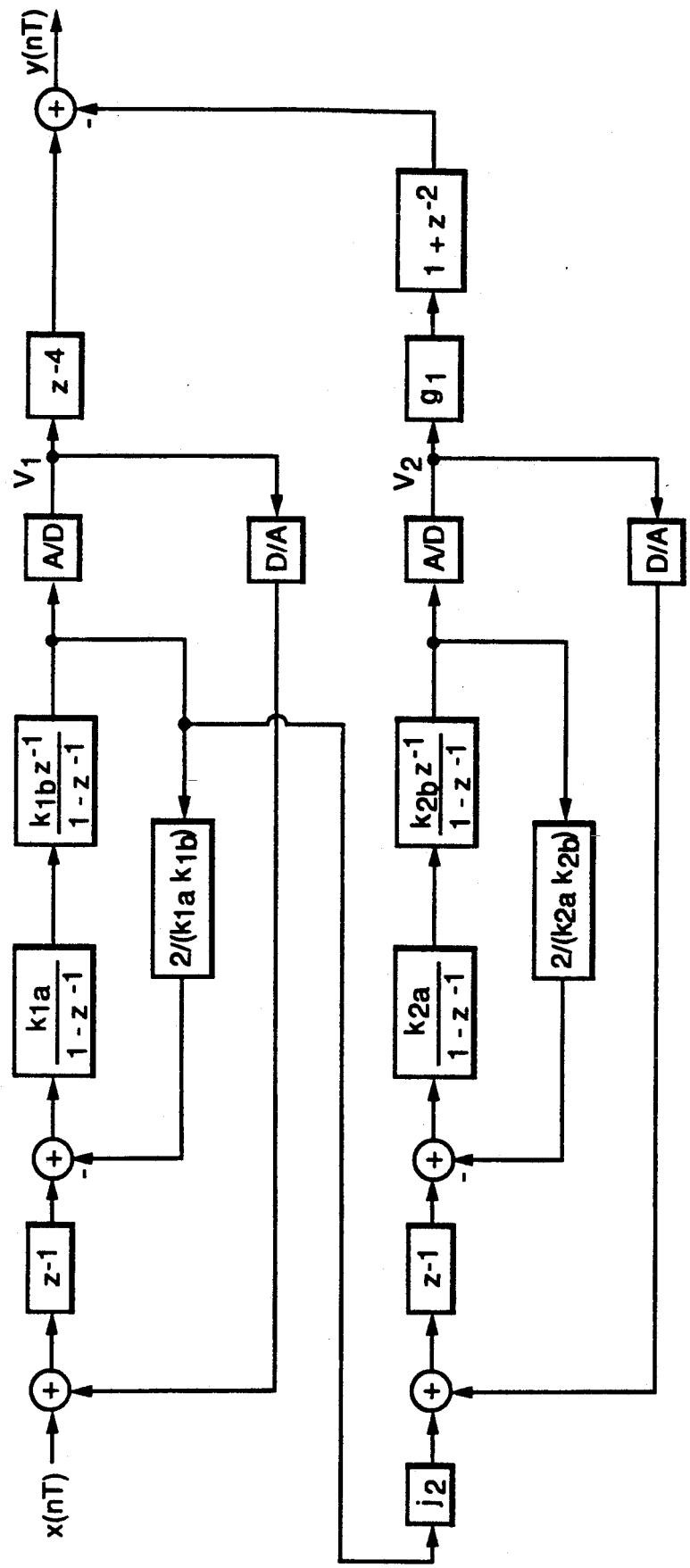
Figure 14:
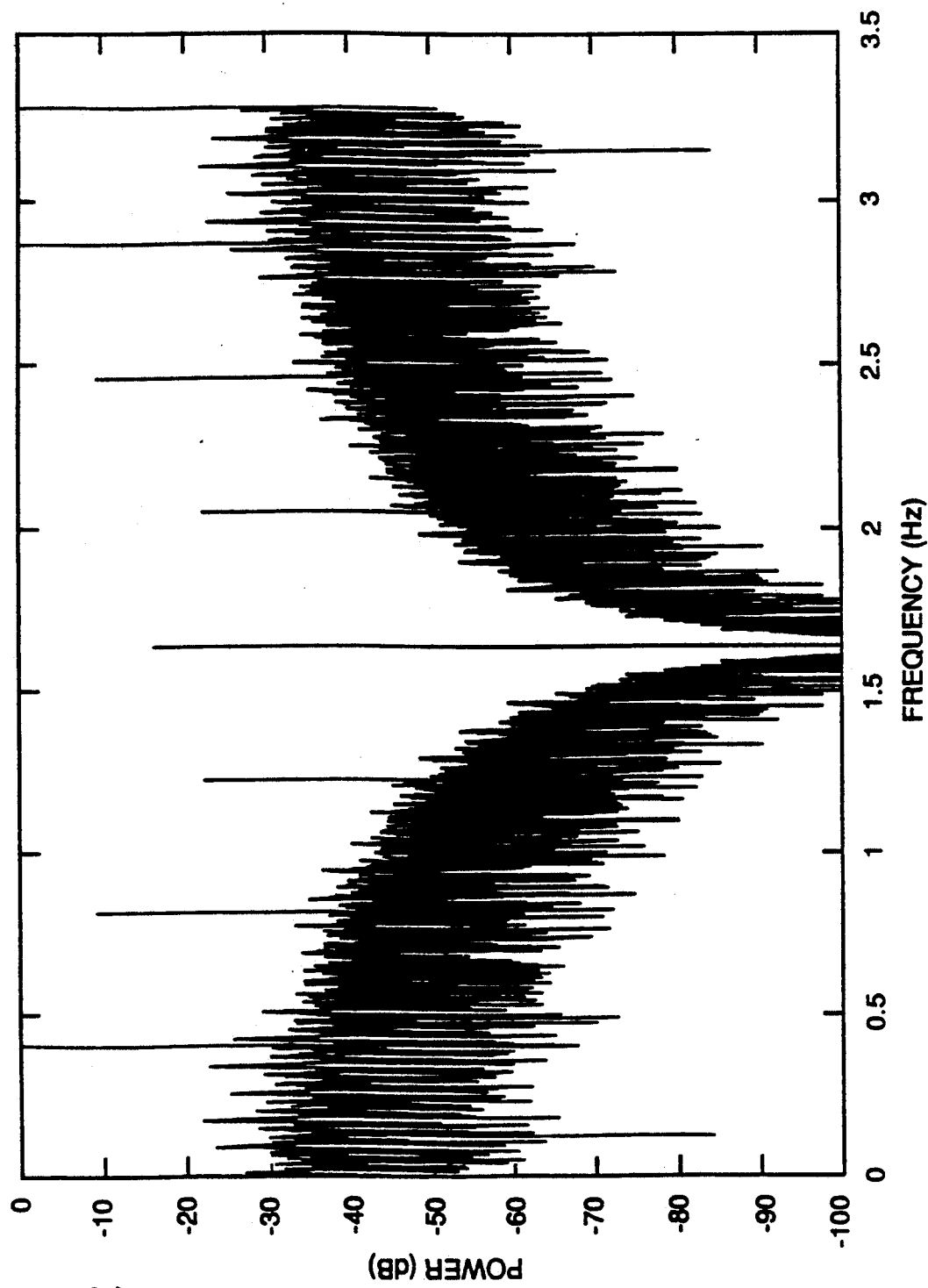
FIG. 14 is a graph showing a fast Fourier transform (FFT) spectrum of the output signal of the modulator shown in FIG. 13A based on a computer simulation.

To clarify application of the unit-delay integrator based resonator of FIG. 6A to the implementation of the bandpass modulators of the present invention, a fourth-order implementation of the MSORC2 type modulator is shown in FIG. 13A. This modulator is designated DSORC2 as an abbreviation for Double Second-Order Resonator Cascade 2. Similarly, in FIG. 13B, an alternative DSORC2 modulator is shown that employs the resonator structure introduced in FIG. 7A. A behavioral simulation of the DSORC2 modulator has been performed and a Fast Fourier Transform spectrum of its output signal is shown in FIG. 14. The DSORC2 input signal here is a sine wave at frequency $F_s/4$, and the attenuation of the quantization noise in the output spectrum is readily apparent.

As to performance of the invention using conventional one micron CMOS (complementary metal-oxide-semiconductor) technology, it is expected that 16-bit A/D conversion of signals centered at 2.5 MHz with 80 kHz bandwidth is feasible, as is 12-bit conversion of signals centered at 10 MHz with 625 kHz bandwidth. Conventional A/D conversion in one micron CMOS is capable of only 16-bit and 12-bit resolution up to 80 kHz and 1 MHz signal frequencies, respectively.

It should be noted that high resolution output signals can be produced by the invention using a modification of the $\Sigma$-$\Delta$ modulator shown in any of FIGS. 15-18 in the aforementioned Ribner U.S. Pat. No. 5,084,702 or a modification of $\Sigma$-$\Delta$ modulators 30, 301, 302, 303 or 304 in the aforementioned Ribner U.S. Pat. No. 5,103,229, both of which patents are hereby incorporated by reference. Such $\Sigma$-$\Delta$ modulator of either of these patents, modified as described below, is coupled to the output of any of the multistage delta sigma A/D converters of FIGS. 9-12, 13A and 13B. The modification requires that a resonator be employed instead of an integrator in the $\Sigma$-$\Delta$ modulator, and one-sample delay element 361 of 1/Z in U.S. Pat. No. 5,084,702 be replaced by an inverting two-sample delay element; also, in U.S. Pat. No. 5,103,229, polarity of the feedback signal to adder 31 in FIGS. 1-8 must be positive instead of negative, and likewise, in U.S. Pat. No. 5,084,702, polarity of the feedback signal to adder 31 in FIGS. 15-19 is positive. Finally, the digital combining hardware in U.S. Pat. No. 5,084,702 and 5,103,229 requires all single delays (1/z) to be replaced by inverting double delays. The resulting system can provide high resolution analog-to-digital conversion without an excessively high oversampling ratio.

While the invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. An improved oversampling delta-sigma analog-to-digital converter system for high-frequency, narrow-band signals, said system having a plurality of delta-sigma modulator stages for providing respective digital output signals responsive to respective analog input signals, each of said modulator stages including an analog-to-digital converter and having a digital-to-analog converter in a feedback loop, said improved oversampling converter system comprising:

a first resonator in each respective modulator stage situated to provide analog signals to said analog-todigital converter in said stage and having a z transform transfer function $$\frac{z^{-2}}{1+z^{-2}}$$

so as to enable said modulator stage; and means for combining the digital output signals of said plurality of delta-sigma modulator stages to suppress, in a resulting combined highly stable signal, quantization noise arising in at least one of said stages.

2. The improved oversampling delta-sigma analog-to-digital converter system of claim 1, further comprising:

means for applying an analog signal to be digitized by said improved oversampling delta-sigma analog-to-digital converter system as the analog input signal of a first one of said plurality of delta-sigma modulator stages; and quantization noise-producing means in each of said plurality of delta-sigma modulator stages except a final stage for determining the quantization noise of said delta-sigma modulator stages except the final stage, respectively, each said quantization noise-producing means being coupled to a subsequent one of said delta-sigma modulator stages, respectively, to provide an analog input signal thereto;

said digital-to-analog converter in each respective one of said plurality of delta-sigma modulator stages being coupled between the output of said analog-to-digital converter and the input to said resonator.

3. The improved oversampling delta-sigma analog-to-digital converter system of claim 2 wherein said means for combining the digital output signals of said plurality of delta-sigma modulator stages comprises:

cosine filter means having a z domain transfer function $(1+z^{-2})^{N-1}$ for digitally filtering the output of said final delta-sigma modulator stage, N being the total number of said delta-sigma modulator stages;

delay means for providing a compensating delay to the output of the first delta-sigma modulator stage; and means for combining outputs of said cosine filter means and said delay means to produce an output signal for said oversampling delta-sigma analog-to-digital converter system.

4. The improved oversampling delta-sigma analog-to-digital converter system of claim 3 wherein said means for combining the digital output signals of said plurality of delta-sigma modulator stages further comprises additional cosine filter means having a z domain transfer function $(1+z^{-2})^{N-2}$ for digitally filtering the output of the next-to-final delta-sigma modulator stage; and wherein said means for combining outputs of said cosine filter means and said delay means also combines the output of said additional cosine filter means.

5. The improved oversampling delta-sigma analog-to-digital converter system of claim 1 wherein:

each one of said plurality of delta-sigma modulator stages comprises two-input adder means having its output coupled to said resonator therein and the digital-to-analog converter output is coupled between the output of said analog-to-digital converter therein and a first input of said adder means therein, the two-input adder of a first delta-sigma modulator stage being adapted to provide an analog signal to be digitized by said improved oversampling delta-sigma analog-to-digital converter system as an input signal to a second input of said two-input adder means of said first stage, and further including:

means coupling the output of the resonator of said first stage to a second input of said adder means of a second delta-sigma modulator stage; and means coupling the output of the resonator of said second stage to a second input of said adder means of a third delta-sigma modulator stage.

6. The improved oversampling delta-sigma analog-to-digital converter system of claim 1 wherein:

at least a first one of said plurality of delta-sigma modulator stages comprises two-input adder means having its output coupled to said resonator therein, a first delta-sigma modulator stage including a second resonator therein, subtractor means adapted to receive an analog input signal at one input thereof and having its output coupled to the input of said second resonator, means coupling the output of the digital-to-analog converter of said first stage to a second input of said subtractor means and a first input of said adder means, and means coupling the output of said second resonator to a second input of said adder means;

a second one of said delta-sigma modulator stages comprises a two-input adder having its output coupled to said first resonator therein and one input coupled to the output of said digital-to-analog converter therein;

and said oversampling delta-sigma analog-to-digital converter system further comprises:

additional subtractor means having a first input coupled to the output of the first resonator of said first delta-sigma modulator stage and a second input coupled to the output of said digital-to-analog converter of said first delta-sigma modulator stage; and means coupling the output of said additional subtractor means to the second input of said two-input adder of said second delta-sigma modulator stage.

7. The improved oversampling delta-sigma analog-to-digital converter system of claim 6 wherein said means for combining the digital output signals of said plurality of delta-sigma modulator stages comprises:

cosine filter means having a z domain transfer function $(1+z^{-2})^2$ for digitally filtering the output of said second delta-sigma modulator stage;

delay means for providing a compensating delay to the output of the first delta-sigma modulator stage; and means for combining outputs of said cosine filter means and said delay means to produce an output signal for said oversampling delta-sigma analog-to-digital converter system.

8. The improved oversampling delta-sigma analog-to-digital converter system of claim 1 wherein at least one of said resonators comprises:

an analog subtractor connected to receive a minuend input analog signal and a subtrahend feedback analog signal for producing a difference output signal;

a double delay device for receiving said difference output signal and generating a resonator output signal; and means for feeding back an output signal from said resonator to said analog subtractor as said feedback signal and for producing said output signal at said resonator output.

9. The improved oversampling delta-sigma analog-to-digital converter system of claim 1 wherein at least one of said resonators comprises:
- a first analog subtractor for receiving a minuend input analog signal and an outside loop feedback subtrahend signal and for producing a first difference output signal;
- a first integrator for receiving said first difference output signal and for generating a first integrated output signal in response thereto;
- a second analog subtractor for receiving said first integrated output as a minuend signal and an inside loop feedback subtrahend signal and for producing a second difference output signal; and
- a second integrator for receiving said second difference output signal and for generating a second integrated output signal in response thereto, said second integrated output signal being the output signal of said one of said resonators; and
- means for generating said outside loop feedback signal and said inside loop feedback signal from said second integrated output signal.

10. The improved oversampling delta-sigma analog-to-digital converter system of claim 9 wherein said first and second integrators comprise respective switched capacitor integrators.

11. The improved oversampling delta-sigma analog-to-digital converter system of claim 1 wherein at least one of said resonators comprises:
- a first delay unit for receiving an analog input signal and delaying said analog input signal so as to generate a delayed analog input signal;
- an analog subtractor for receiving said delayed analog input minuend signal and a feedback subtrahend signal and for producing a difference output signal;
- a first integrator for integrating said difference output signal so as to generate a first integrated output signal;
- a delayed integrator for delaying and integrating said first integrated output signal to generate a second integrated output signal, said second integrated output signal being the output signal of said at least one resonator; and
- means responsive to said second integrated output signal for generating said feedback signal.

12. The improved oversampling delta-sigma analog-to-digital converter system of claim 11 wherein said first and second integrators comprise respective switched capacitor integrators.

13. The improved oversampling delta-sigma analog-to-digital converter system of claim 1 wherein at least one of said resonators comprises a differential pseudo two-path integrator.

14. The improved oversampling delta-sigma analog-to-digital converter system of claim 1 wherein:
- at least a first one of said plurality of delta-sigma modulator stages comprises two-input adder means having its output coupled to said resonator therein, a first delta-sigma modulator stage including a second resonator therein, subtractor means adapted to receive an analog input signal at one input thereof and having its output coupled to the input of said second resonator, means coupling the output of the digital-to-analog converter of said first stage to a second input of said subtractor means and a first input of said adder means, and means coupling the output of said second resonator to a second input of said adder means;
- a second delta-sigma modulator stage including a second two-input adder having its output coupled to said first resonator therein and one input coupled to the output of said digital-to-analog converter therein;
- means coupling the output of said second resonator of said first delta sigma modulator stage to a second input of said second adder means;
- and wherein said oversampling delta-sigma analog-to-digital converter system further comprises:
  - additional subtractor means having a first input coupled to the output of the analog-to-digital converter of said first delta-sigma modulator stage and a second input coupled to the output of said analog-to-digital converter of said second delta-sigma modulator stage;
  - a third two-input adder means;
  - means coupling the output of said analog-to-digital converter of said first delta-sigma modulator stage to a first input of said third two-input adder means; and
  - means coupling the output of said additional subtractor means to the second input of said third two-input adder means.

15. The improved oversampling delta-sigma analog-to-digital converter system of claim 14 wherein said means coupling the output of said additional subtractor means to the second input of said third two-input adder means comprises cosine filter means having a z domain transfer function $(1+z^{-2})^2$ for digitally filtering the output of said second delta-sigma modulator stage, and wherein said means coupling the output of said analog-to-digital converter of said first delta-sigma modulator stage to a first input of said two-input adder comprises delay means for providing a compensating delay to the output of the first delta-sigma modulator stage.

* * * * *